(12) United States Patent
Chiu et al.

(10) Patent No.: US 12,272,693 B2
(45) Date of Patent: Apr. 8, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chun-Ya Chiu, Tainan (TW); Chih-Kai Hsu, Tainan (TW); Ssu-I Fu, Kaohsiung (TW); Yu-Hsiang Lin, New Taipei (TW); Chien-Ting Lin, Tainan (TW); Chia-Jung Hsu, Tainan (TW); Chin-Hung Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 448 days.

(21) Appl. No.: 17/700,475

(22) Filed: Mar. 21, 2022

(65) Prior Publication Data
US 2023/0268346 A1 Aug. 24, 2023

(30) Foreign Application Priority Data
Feb. 21, 2022 (CN) .......................... 202210155370.7

(51) Int. Cl.
*H01L 27/092* (2006.01)
*H01L 21/02* (2006.01)
*H01L 21/3105* (2006.01)
*H01L 21/8238* (2006.01)

(52) U.S. Cl.
CPC ...... *H01L 27/0922* (2013.01); *H01L 21/0214* (2013.01); *H01L 21/02164* (2013.01); *H01L 21/02271* (2013.01); *H01L 21/31053* (2013.01); *H01L 21/823821* (2013.01); *H01L 21/823878* (2013.01); *H01L 27/0924* (2013.01)

(58) Field of Classification Search
CPC ............ H01L 27/0922; H01L 21/0214; H01L 21/02164; H01L 21/02271; H01L 21/31053; H01L 21/823821; H01L 21/823878; H01L 27/0924; H01L 21/823412; H01L 21/823462; H01L 29/66795; H01L 21/76224; H01L 29/785
See application file for complete search history.

(56) References Cited

U.S. PATENT DOCUMENTS

| | | | |
|---|---|---|---|
| 2004/0058508 A1 | 3/2004 | Parat et al. | |
| 2014/0227857 A1 | 8/2014 | Youn | |
| 2019/0252522 A1* | 8/2019 | Thees | ............... H01L 29/78603 |
| 2022/0037202 A1* | 2/2022 | Lin | ................... H01L 21/76834 |
| 2022/0302114 A1* | 9/2022 | Chuang | ............... H01L 29/0847 |

FOREIGN PATENT DOCUMENTS

DE   10 2020 112 203 A1   9/2021

* cited by examiner

*Primary Examiner* — Karen Kusumakar
*Assistant Examiner* — Adam S Bowen
(74) *Attorney, Agent, or Firm* — Winston Hsu

(57) ABSTRACT

A method for fabricating a semiconductor device includes the steps of: providing a substrate having a high-voltage (HV) region and a low-voltage (LV) region; forming a base on the HV region and fin-shaped structures on the LV region; forming a first insulating around the fin-shaped structures; removing the base, the first insulating layer, and part of the fin-shaped structures to form a first trench in the HV region and a second trench in the LV region; forming a second insulating layer in the first trench and the second trench; and planarizing the second insulating layer to form a first shallow trench isolation (STI) on the HV region and a second STI on the LV region.

20 Claims, 8 Drawing Sheets

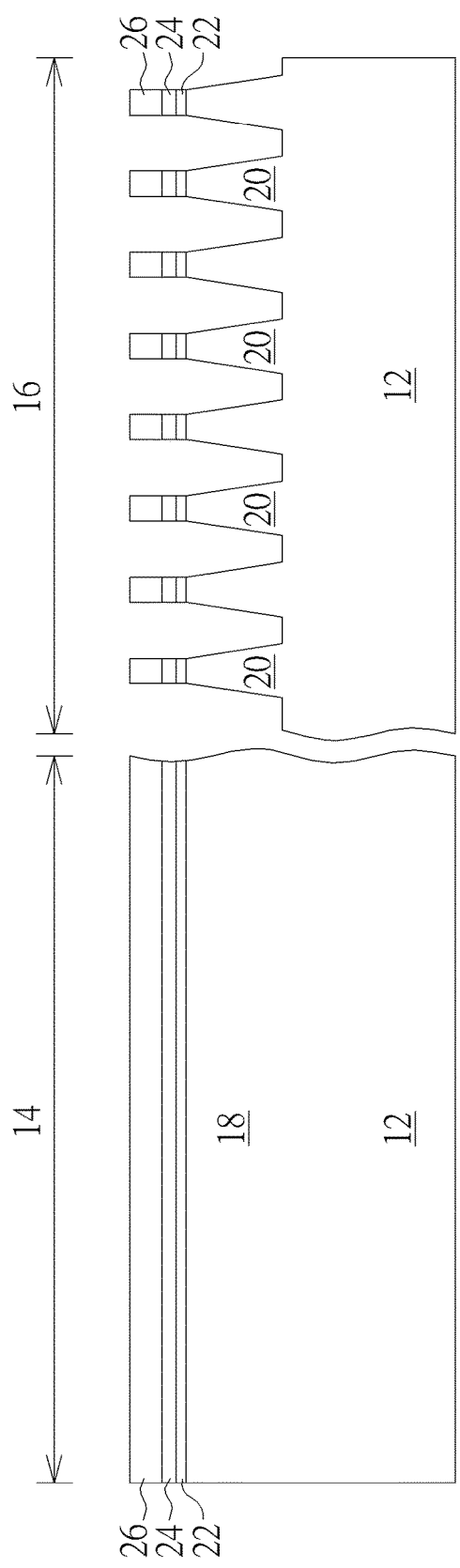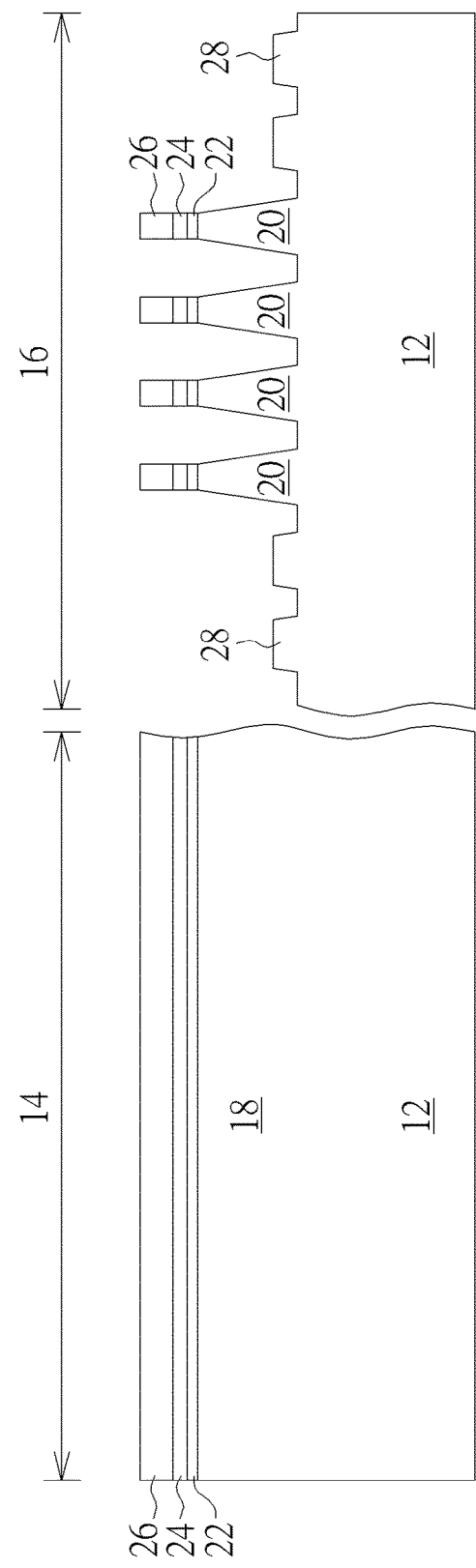

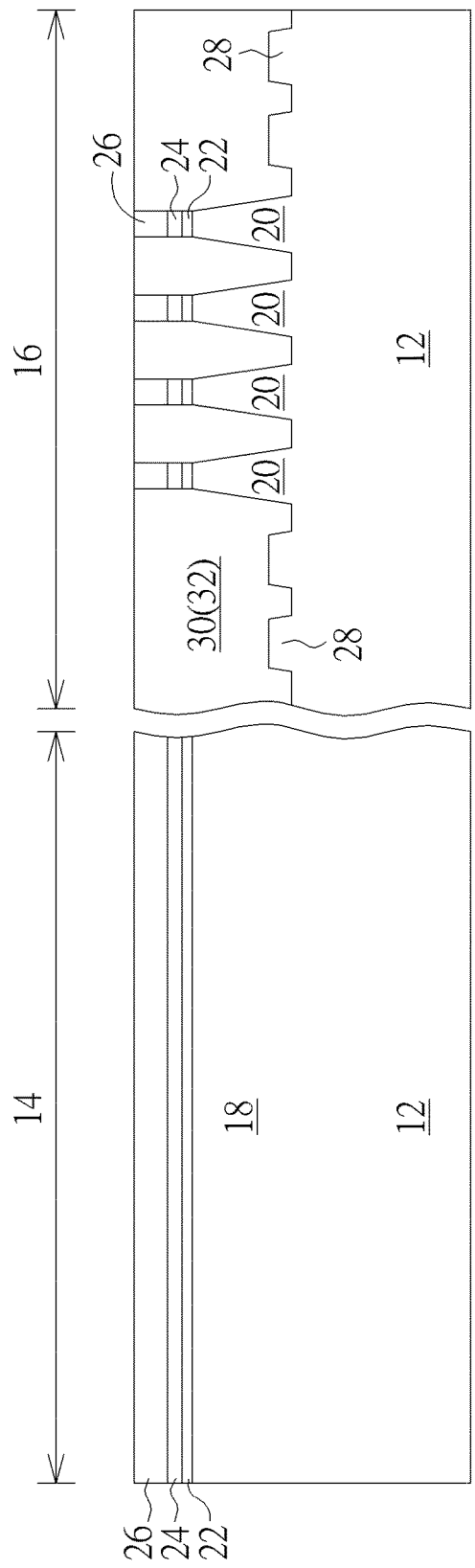
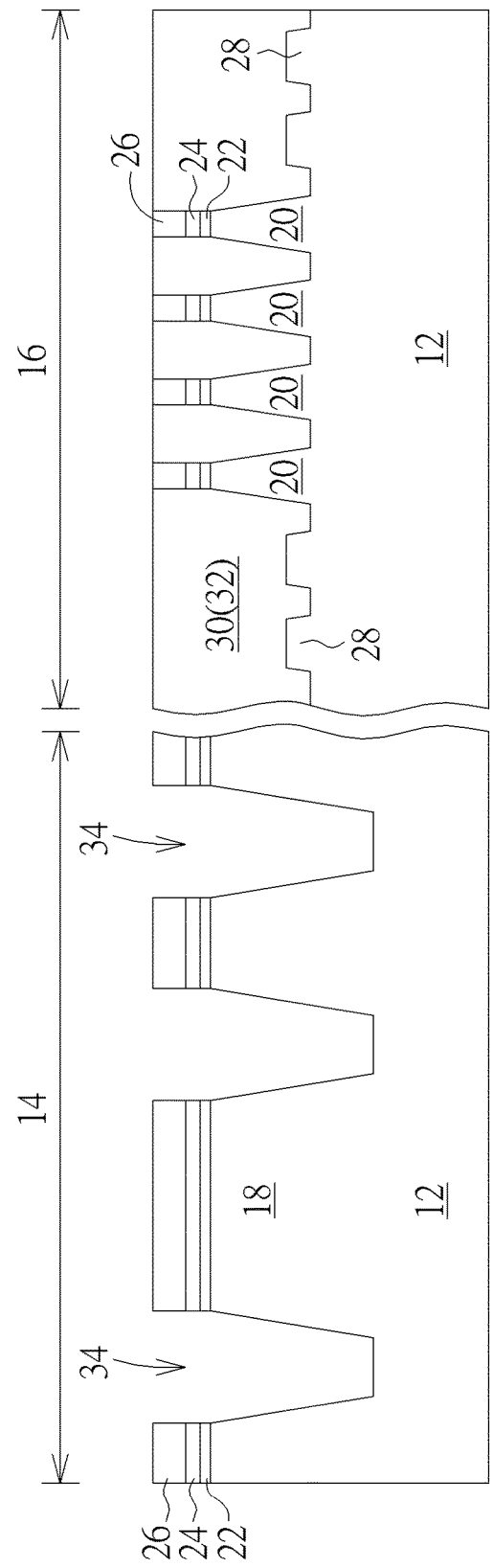
FIG. 3
FIG. 4

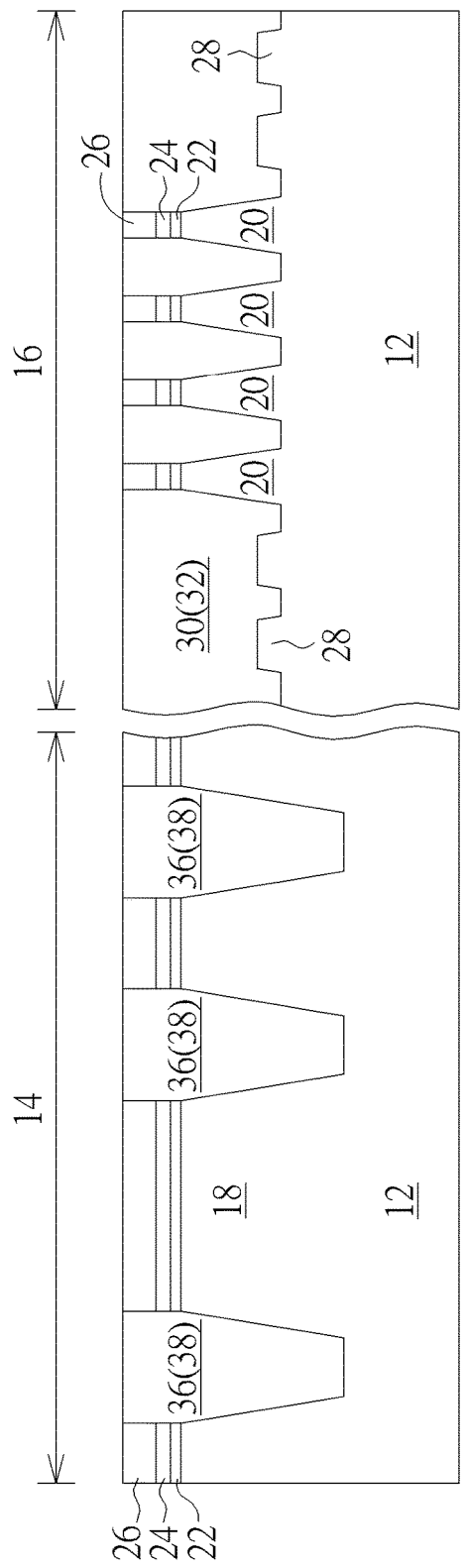
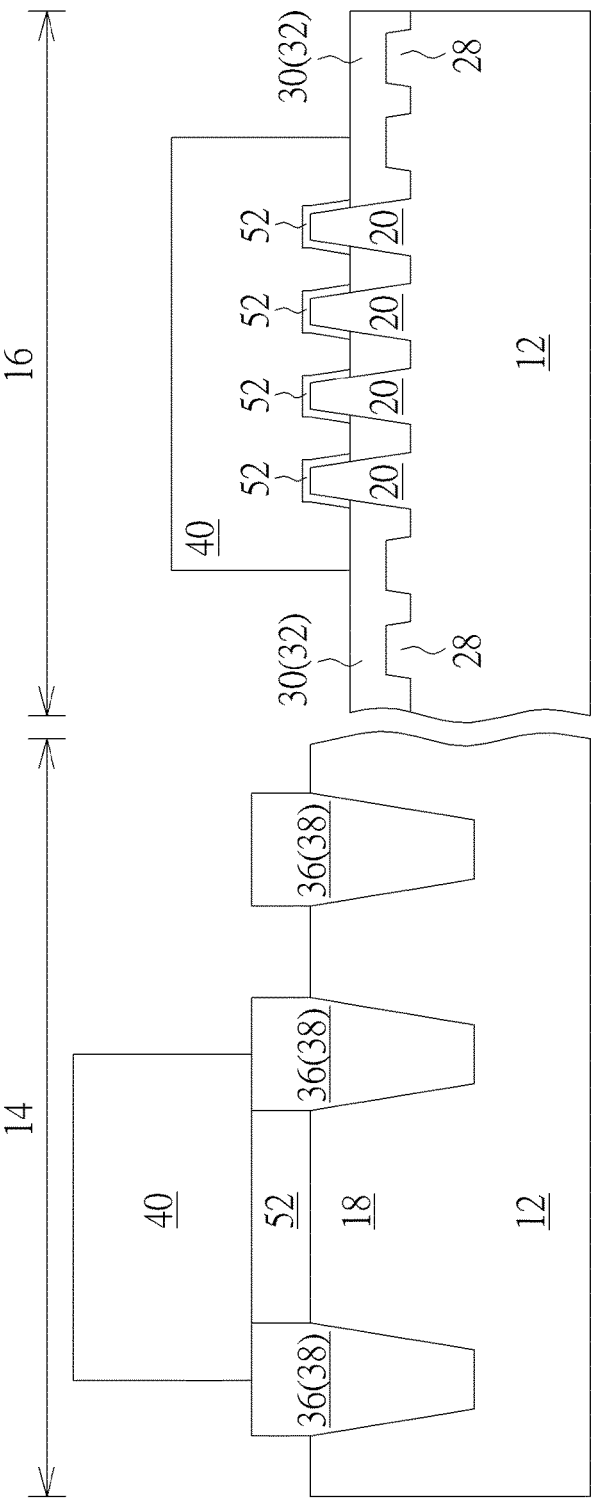

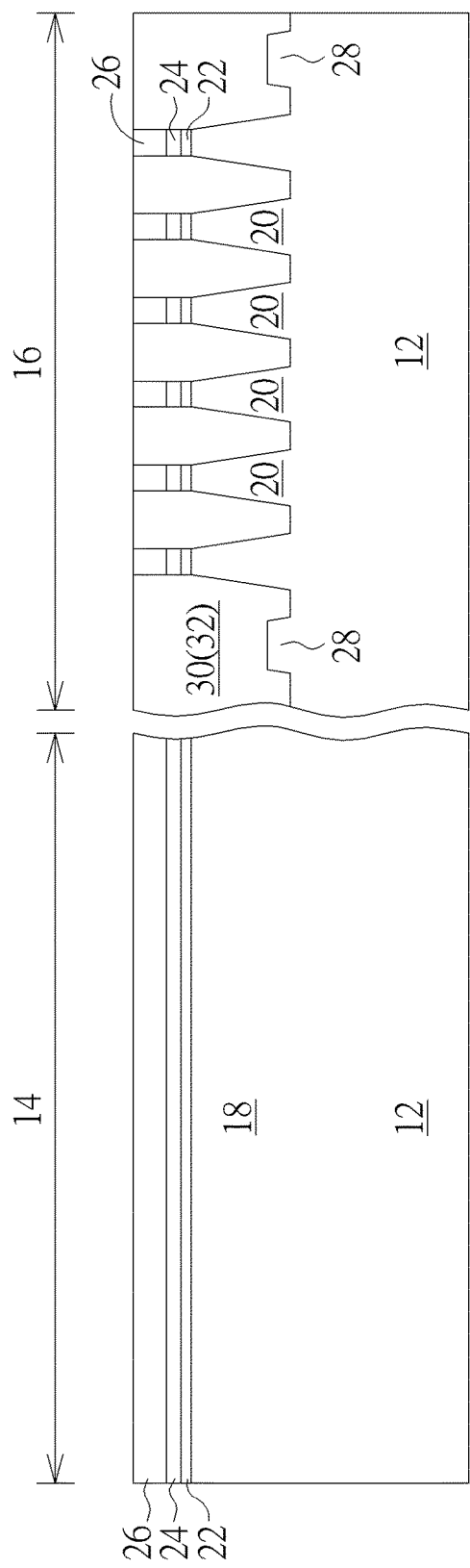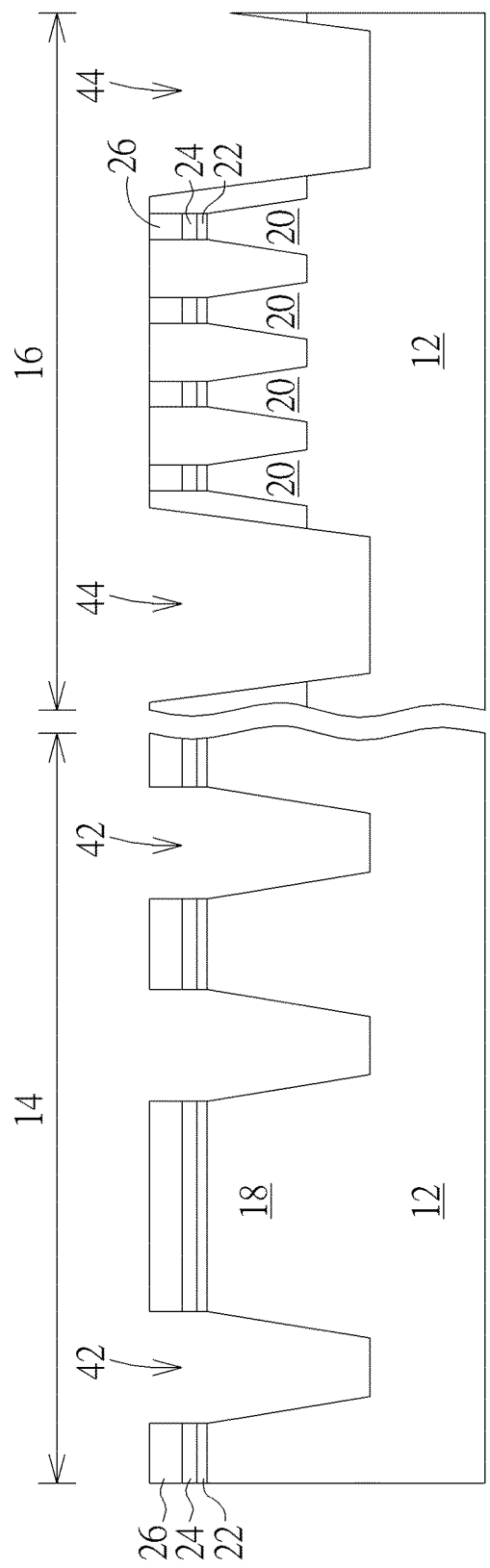

SEMICONDUCTOR DEVICE AND METHOD FOR FABRICATING THE SAME

BACKGROUND OF THE INVENTION

1. Field of the Invention

The invention relates to a method of fabricating semiconductor device, and more particularly to a method of integrating high-voltage (HV) device and low-voltage (LV) device.

2. Description of the Prior Art

In current semiconductor processing, controllers, memories, circuits of low-voltage operation and power devices of high-voltage operation are largely integrated into a single chip to achieve a single-chip system. The power device or high-voltage (HV) device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a method for fabricating a semiconductor device includes the steps of: providing a substrate having a high-voltage (HV) region and a low-voltage (LV) region; forming a base on the HV region and fin-shaped structures on the LV region; forming a first insulating around the fin-shaped structures; removing the base, the first insulating layer, and part of the fin-shaped structures to form a first trench in the HV region and a second trench in the LV region; forming a second insulating layer in the first trench and the second trench; and planarizing the second insulating layer to form a first shallow trench isolation (STI) on the HV region and a second STI on the LV region.

According to another aspect of the present invention, a semiconductor device includes a substrate having a high-voltage (HV) region and a low-voltage (LV) region, a base on the HV region and fin-shaped structures on the LV region, a first shallow trench isolation (STI) around the fin-shaped structures, and a second STI around the first STI. Preferably, the first STI and the second STI have different depths.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 illustrate a method for fabricating a semiconductor device according to an embodiment of the present invention.

FIGS. 7-10 illustrate a method for fabricating a semiconductor device according to an embodiment of the present invention.

DETAILED DESCRIPTION

Figure 9:
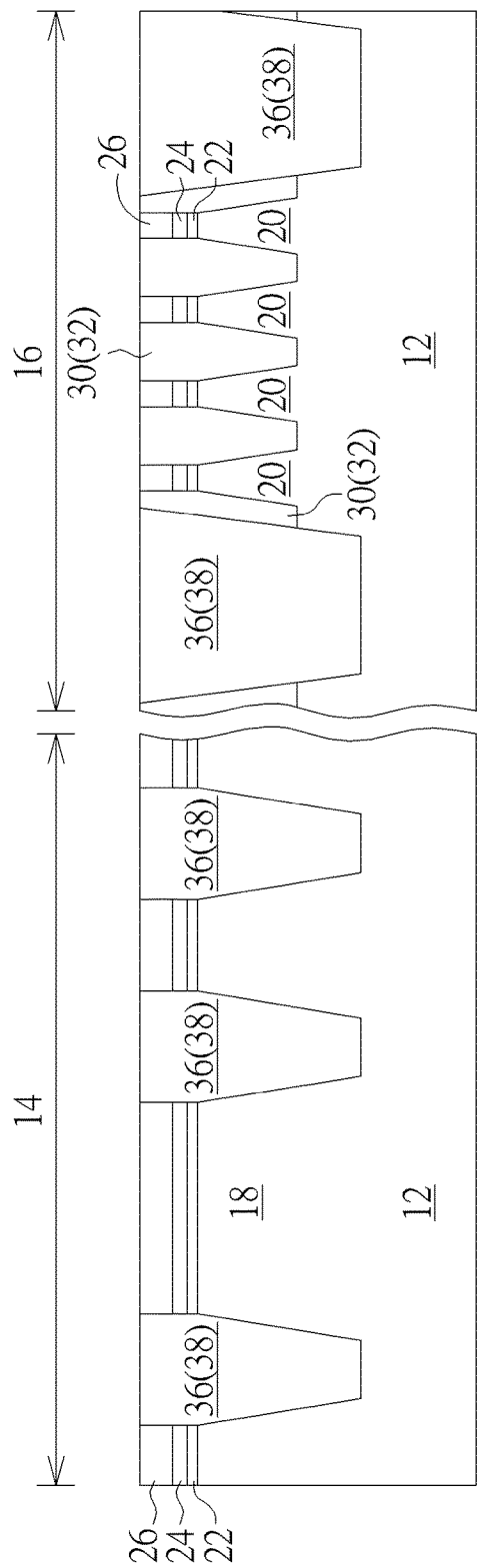

Referring to FIGS. 1-6, FIGS. 1-6 illustrate a method for fabricating a semiconductor device according to an embodiment of the present invention. As shown in FIG. 1, a substrate 12, such as a silicon substrate or silicon-on-insulator (SOI) substrate is provided and two or more transistor regions, such as a high voltage (HV) region 14 and a low-voltage (LV) region 16 are defined on the substrate 12, in which at least a HV device will be formed on the HV region 14 while at least a LV device will be formed on the LV region 16 in the later process. In this embodiment, the HV region 14 and the LV region 16 could be transistor regions having same conductive type or different conductive types. For instance, each of the two regions 14, 16 could be a PMOS region or a NMOS region and the two regions 14 and 16 are defined to fabricate gate structures having different threshold voltages in the later process. Preferably, it would be desirable to first conduct an implantation process to form p-type deep wells on the HV region 14 and a n-type deep well on the LV region 16, but not limited thereto.

Next, a base 18 is formed on the HV region 14 and a plurality of fin-shaped structures 20 are formed on the substrate 12 of the LV region 16. Preferably, the base 18 and the fin-shaped structures 20 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the base 18 and the fin-shaped structures 20 could also be obtained by first forming a patterned mask (not shown) on the substrate, 12, and through an etching process, the pattern of the patterned mask is transferred to the substrate 12 to form the base 18 and the fin-shaped structures 20. Moreover, the formation of the base 18 and the fin-shaped structures 20 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the base 18 and fin-shaped structures 20. These approaches for forming the base 18 and fin-shaped structures 20 are all within the scope of the present invention.

In this embodiment, a liner 22, a liner 24, and a hard mask 26 could be formed on each of the base 18 and the fin-shaped structures 20 during the aforementioned patterning process, in which the liner 22 preferably includes silicon oxide ($SiO_2$), the liner 24 includes silicon nitride (SiN), and the hard mask 26 includes silicon oxide ($SiO_2$), but not limited thereto.

Next, as shown in FIG. 2, a fin removal and/or a fin cut process is conducted to remove part of the fin-shaped structures 20 on the LV region 16 for forming bumps 28 adjacent to the fin-shaped structures 20. In this embodiment, the fin removal process is employed to remove part of the fin-shaped structures extending along the same direction while the fin cut process is conducted to divide the round shape fin-shaped structures into a plurality of separate and independent fin-shaped structures all extending along the same direction.

Next, as shown in FIG. 3, a flowable chemical vapor deposition (FCVD) process is conducted to form an insulating layer 30 made of SiONH on the base 18, the bumps 28 and the fin-shaped structures 20 and filling the trenches between the fin-shaped structures 20, and a planarizing process such as chemical mechanical polishing (CMP) process is conducted to remove part of the insulating layer 30 so that the top surfaces of the hard mask 26 and the insulating layer 30 are coplanar. Preferably, the remaining insulating layer 30 around the fin-shaped structures 20 on the LV region 16 at this stage now becomes a shallow trench isolation (STI) 32.

Next, as shown in FIG. 4, a photo-etching process is conducted by first forming a patterned mask (not shown) such as patterned resist on the HV region 14 and LV region 16 and exposing part of the hard mask 26 surface, and then conducting an etching process by using the patterned mask as mask to remove part of the hard mask 26, part of the liner 24, part of the liner 22, and part of the substrate 18 on the HV region 14 to form a plurality of trenches 34 as the depth of the trenches 34 is substantially greater than the depth of the trenches between the fin-shaped structures 20.

Next, as shown in FIG. 5, a sub-atmospheric chemical vapor deposition (SACVD) process is conducted to form another insulating layer 36 on the HV region 14 and LV region 16 and filling the trenches 34 completely, and then a planarizing process such as a CMP process is conducted by using the hard mask 26 as a stop layer to remove part of the insulating layer 36. At this stage, the remaining insulating layer 36 around the base 18 on the HV region 14 preferably becomes a STI 38 while the top surfaces of the STI 38 and the STI 32 on the LV region 16 are coplanar. It should be noted that the insulating layer 36 formed at this stage and the insulating layer 30 formed in FIG. 3 are preferably made of different materials. For instance, the insulating layer 30 or the STI 32 formed in FIG. 3 is made of SiONH while the insulating layer 36 or STI 38 formed at this stage is made of $SiO_2$.

It should further be noted that the SACVD process conducted at this stage preferably uses tetraethyl orthosilicate (TEOS) and ozone ($O_3$) as precursor and forms silicon dioxide as sedimentary deposit in the later stage. The FCVD process conducted in FIG. 3 on the other hand uses trisilyamine, ammonia gas ($NH_3$), and oxygen gas ($O_2$) as precursor and forms SiONH as sedimentary deposit in the later stage.

Next, as shown in FIG. 6, it would be desirable to first remove the hard mask 26 and liners 22, 24 on the HV region 14 and LV region 16 and part of the STI 32 on the LV region 16, and then conduct one or more oxidation process such as an in-situ steam generation (ISSG) process to form a gate dielectric layer 52 made of silicon oxide on the base 18 of HV region 14 and fin-shaped structures 20 of LV region 16. Next, gate structures 40 or dummy gates could be formed on the base 18 and the fin-shaped structures 24 on the HV region 14 and LV region 18 respectively.

In this embodiment, the formation of the gate structures 40 could be accomplished by a gate first process, a high-k first approach from gate last process, or a high-k last approach from gate last process. Next, it would be desirable to form a spacer adjacent to each of the gate structures 40, form a source/drain region in the substrate 12 adjacent to the spacer, form an interlayer dielectric (ILD) layer (not shown) around the gate structures, and then selectively conduct a replacement metal gate (RMG) process to transform the gate structures into metal gates. Since the transformation of dummy gate structures into metal gates through RMG process is well known to those skilled in the art, the details of which are not explained herein for the sake of brevity.

Referring to FIGS. 7-10, FIGS. 7-10 illustrate a method for fabricating a semiconductor device according to an embodiment of the present invention. As shown in FIG. 7, it would be desirable to first form a base 18 and fin-shaped structures 20 as disclosed in FIGS. 1-2 and then conduct a fin removal process to remove part of the fin-shaped structures 20 on the LV region 16 for forming bumps 28 adjacent to the fin-shaped structures 20. It should be noted that since no fin cut process is conducted in this embodiment, only two fin-shaped structures are removed on the LV region 16 for exemplary purpose. Next, a FCVD process could be conducted as shown in FIG. 3 to form an insulating layer 30 made of SiONH on the base 18 and fin-shaped structures 20 and filling the trenches between the fin-shaped structures 20, and then a planarizing process such as CMP process is conducted to remove part of the insulating layer 30 so that the top surfaces of the hard mask 26 and the insulating layer 30 are coplanar to form a STI 32.

Next, as shown in FIG. 8, a fin cut process is conducted by performing a photo-etching process to remove part of the hard mask 26, part of the liner 24, part of the liner 22, and part of the base 18 on the HV region 14 and part of the hard mask 26, part of the liner 24, part of the liner 22, part of the STI 32, and part of the fin-shaped structures 20 and bumps 28 on the LV region 16 for forming a plurality of trenches 42, 44 on the HV region 14 and LV region 16 respectively. It should be noted that the width of each trench 42 formed on the HV region 14 is slightly less than the width of each trench 44 formed on the LV region 16, the trenches 42 and 44 preferably have same depth, and the depth of the trenches 42, 44 is slightly deeper or greater than the depth of the trenches between fin-shaped structures 20. In other words, the depth of the trenches 44 surrounding the fin-shaped structures 20 is greater than the depth of the trenches between the fin-shaped structures 20 on the LV region 16.

Next, as shown in FIG. 9, a sub-atmospheric chemical vapor deposition (SACVD) process is conducted to form another insulating layer 36 on the HV region 14 and LV region 16 and filling the trenches 42, 44 completely, and then a planarizing process such as a CMP process is conducted by using the hard mask 26 as a stop layer to remove part of the insulating layer 36. At this stage, the remaining insulating layer 36 around the base 18 on the HV region 14 preferably becomes a STI 38 and at the same time the remaining insulating layer 36 around the fin-shaped structures 20 and STI 32 on the LV region 16 also forms another STI 38, the top surfaces of the STI 38 and the STI 32 are coplanar and the bottom surface of the STI 38 is lower than the bottom surface of the STI 32, and the top surfaces and the bottom surfaces of the STI 38 on the HV region 14 and LV region 16 are coplanar. Similar to the aforementioned embodiment, the insulating layer 36 formed at this stage and the insulating layer 30 formed in FIG. 7 are preferably made of different materials. For instance, the insulating layer 30 or the STI 32 formed in FIG. 7 is made of SiONH while the insulating layer 36 or STI 38 formed at this stage is made of $SiO_2$.

Figure 10:
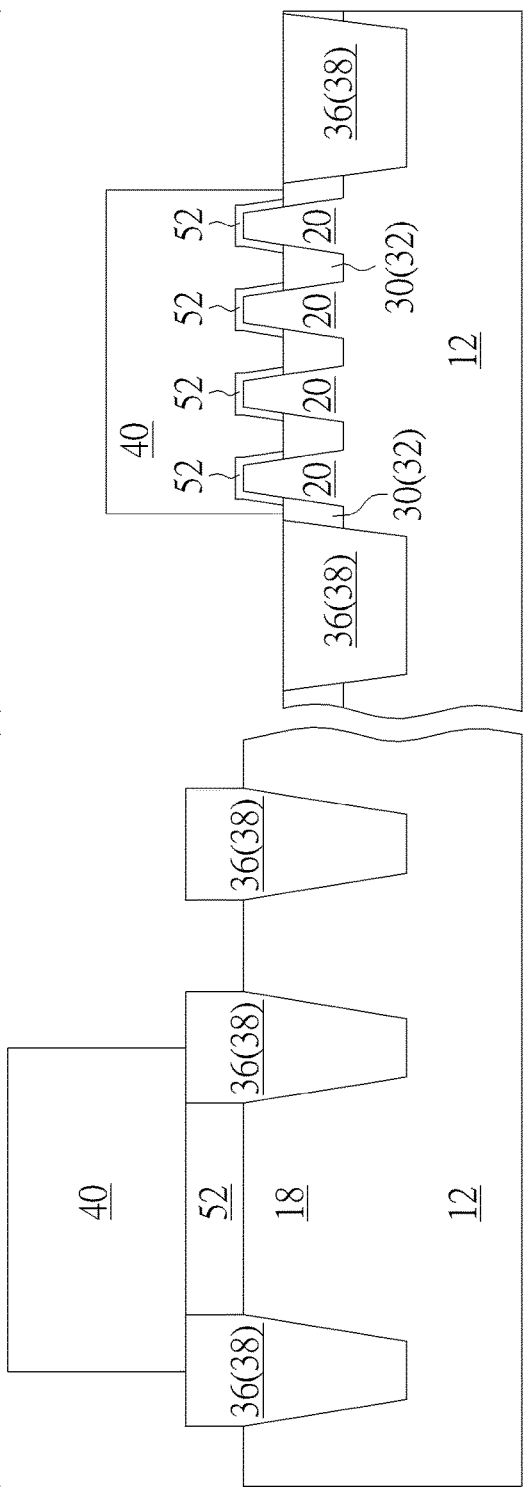

Next, as shown in FIG. 10, it would be desirable to first remove the hard mask 26 and liners 22, 24 on the HV region 14 and LV region 16 and part of the STI 32 and 38 on the LV region 16 as disclosed in FIG. 6, and then conduct one or more oxidation process such as an in-situ steam generation (ISSG) process to form a gate dielectric layer 52 made of silicon oxide on the base 18 of HV region 14 and fin-shaped structures 20 of LV region 16. Next, gate structures 40 or dummy gates could be formed on the base 18 and the fin-shaped structures 24 on the HV region 14 and LV region 16.

In this embodiment, the formation of the gate structures 40 could be accomplished by a gate first process, a high-k first approach from gate last process, or a high-k last approach from gate last process. Next, it would be desirable to form a spacer adjacent to each of the gate structures 40, form a source/drain region in the substrate 12 adjacent to the spacer, form an interlayer dielectric (ILD) layer (not shown) around the gate structures, and then selectively conduct a replacement metal gate (RMG) process to transform the gate structures into metal gates. Since the transformation of dummy gate structures into metal gates through RMG process is well known to those skilled in the art, the details of which are not explained herein for the sake of brevity.

Referring again to FIG. 10, FIG. 10 illustrates a structural view of a semiconductor device according to an embodiment of the present invention. As shown in FIG. 10, the semiconductor device includes a base 18 disposed on the HV region 14 and fin-shaped structures 20 disposed on the LV region 16, a STI 32 surrounding the fin-shaped structures 20, a STI 38 disposed on the LV region 16 and surrounding the STI 32 and the fin-shaped structures 20, and a STI 38 disposed in the base 18 on the HV region 14. Preferably, the STI 32 and the STI 38 are made of different materials while the STI 38 disposed on the HV region 14 and the STI 38 disposed on the LV region 16 are made of same material, in which the STI 32 is made of SiONH and the STI 38 is made of $SiO_2$.

Structurally, the STI 32 and the STI 38 have different depths. Viewing from a more detailed perspective, the top surface of the STI 32 on the LV region 16 is even with the top surface of the STI 38 and the bottom surface of the STI 32 is higher than the bottom surface of the STI 38, the height of the STI 38 on the HV region 14 is greater than the height of the STI 38 on the LV region 16, the top surface of the STIs 32, 38 on the LV region 16 is lower than the top surface of the STI 38 on the HV region 14, and the bottom surface of the STI 38 on the LV region 16 is even with the bottom surface of the STI 38 on the HV region 14. Moreover, the STI 38 on the HV region 14 and the STI 38 on the LV region 16 preferably have different widths, in which the width of the STI 38 on the HV region 14 is less than the width of the STI 38 on the LV region 16.

Figure 11:
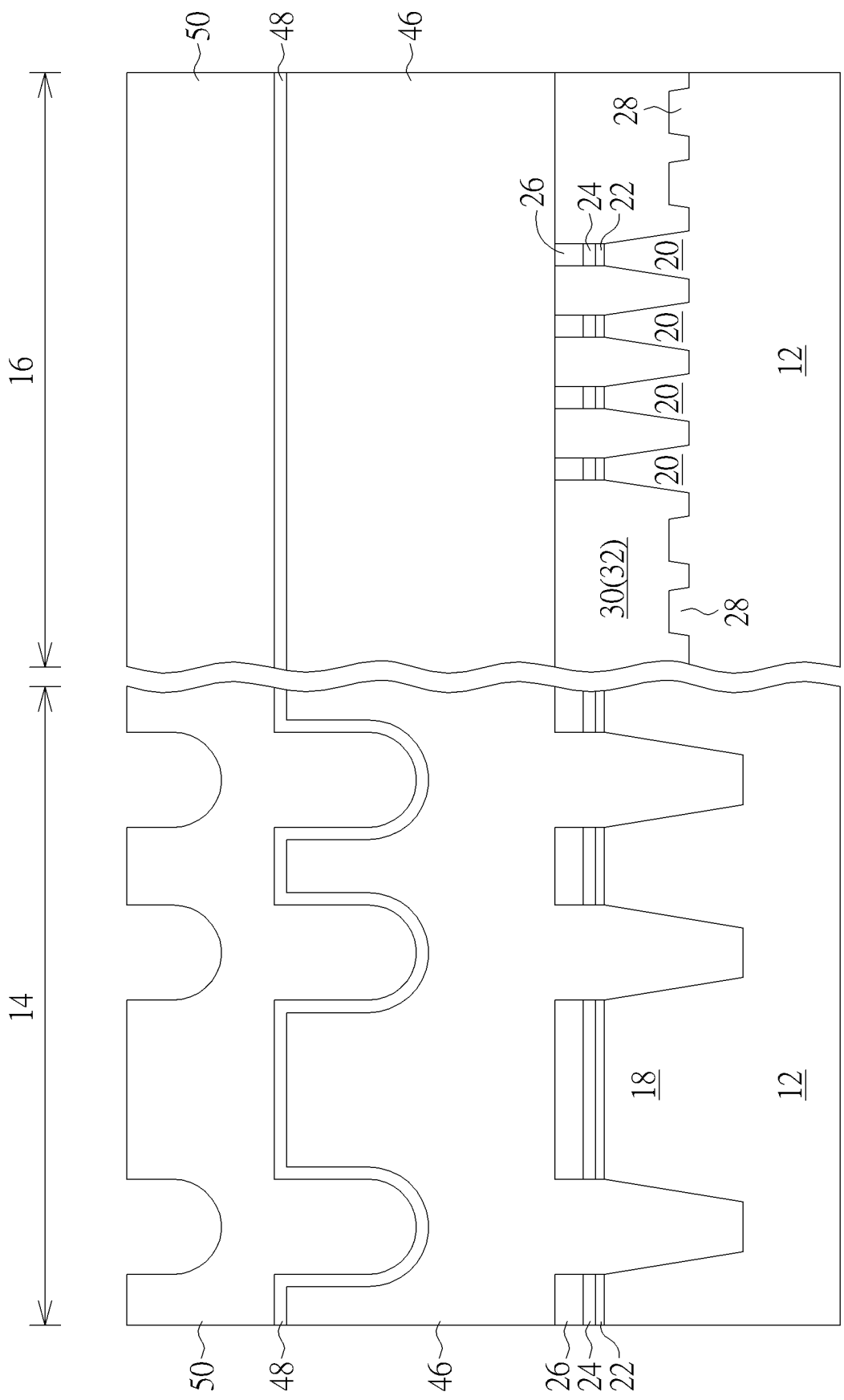
FIGS. 11-14 illustrate a method for fabricating a semiconductor device according to an embodiment of the present invention.

Referring to FIGS. 11-14, FIGS. 11-14 illustrate a method for fabricating a semiconductor device according to an embodiment of the present invention. As shown in FIG. 11, in contrast to forming an insulating layer 36 in the trenches 34 on the HV region 14 and then planarizing part of the insulating layer 36 directly as shown in FIG. 5, it would be desirable to first conduct a SACVD process for forming an insulating layer 46 made of silicon oxide, an insulating layer 48 made of silicon nitride, and another insulating layer 50 made of silicon oxide on the HV region 14 and LV region 16 and filling the trenches 34 on the HV region 14 completely. Preferably, the thickness of the lower insulating layer 46 is approximately 5000 Angstroms, the thickness of the middle insulating layer 48 is 100-200 Angstroms, and the thickness of the upper insulating layer 50 is 2000 Angstroms.

Figure 12:
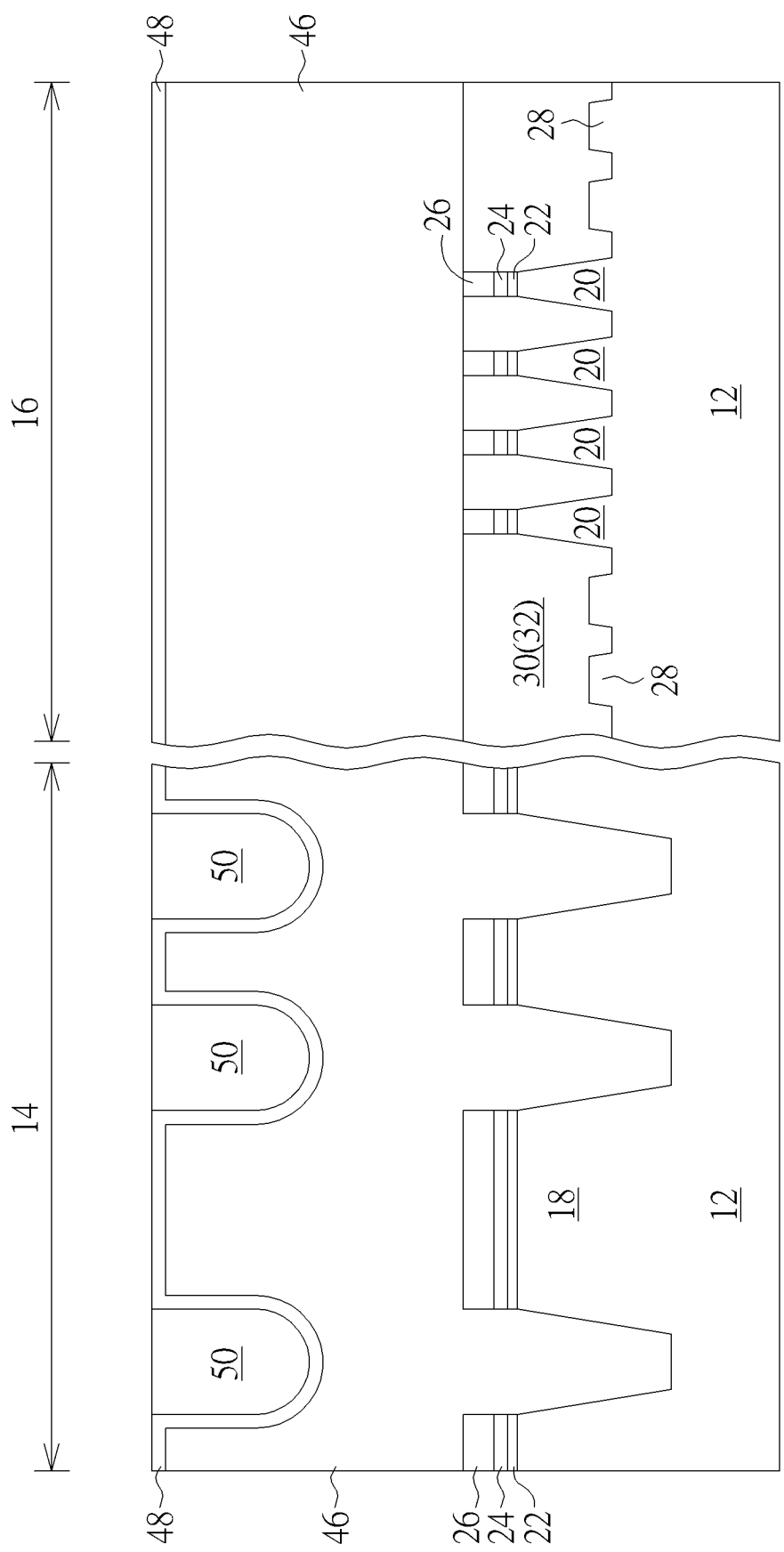

Next, as shown in FIG. 12, a planarizing process such as CMP is conducted to remove part of the upper insulating layer 50 so that the top surface of the remaining insulating layer 50 is even with the top surface of the middle insulating layer 48.

Figure 13:
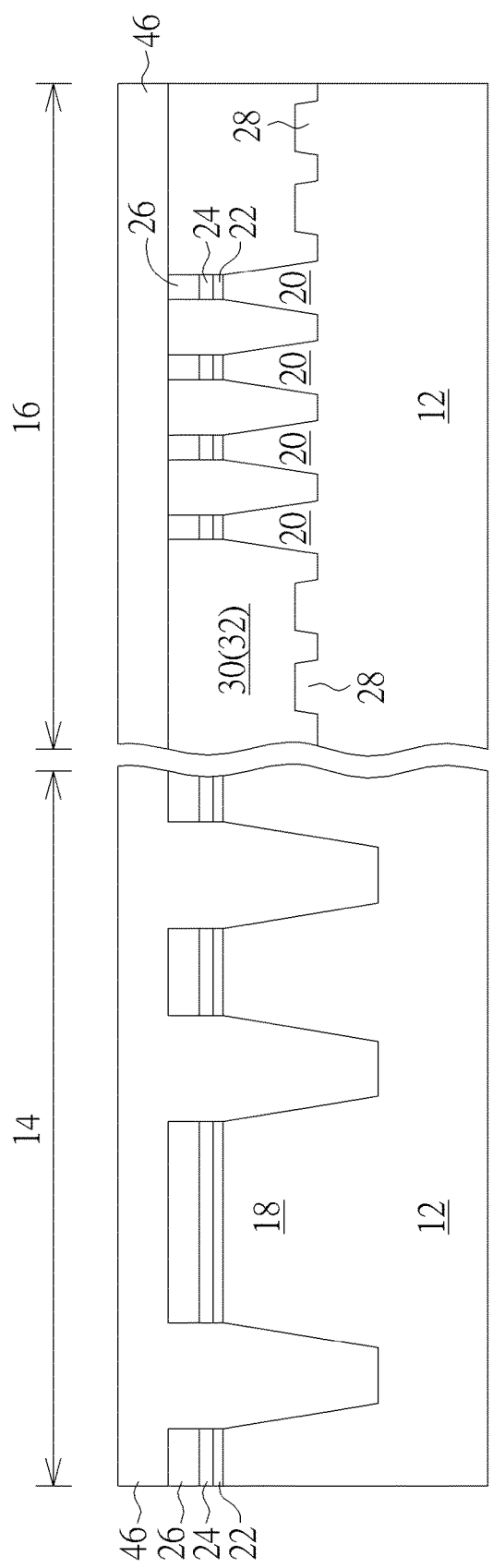

Next, as shown in FIG. 13, an etching back process is conducted to remove all of the upper insulating layer 50, all of the middle insulating layer 48, and part of the lower insulating layer 46 so that the top surface of the remaining insulating layer 46 is still above the top surface of the STI 32 on the LV region 16.

Figure 14:
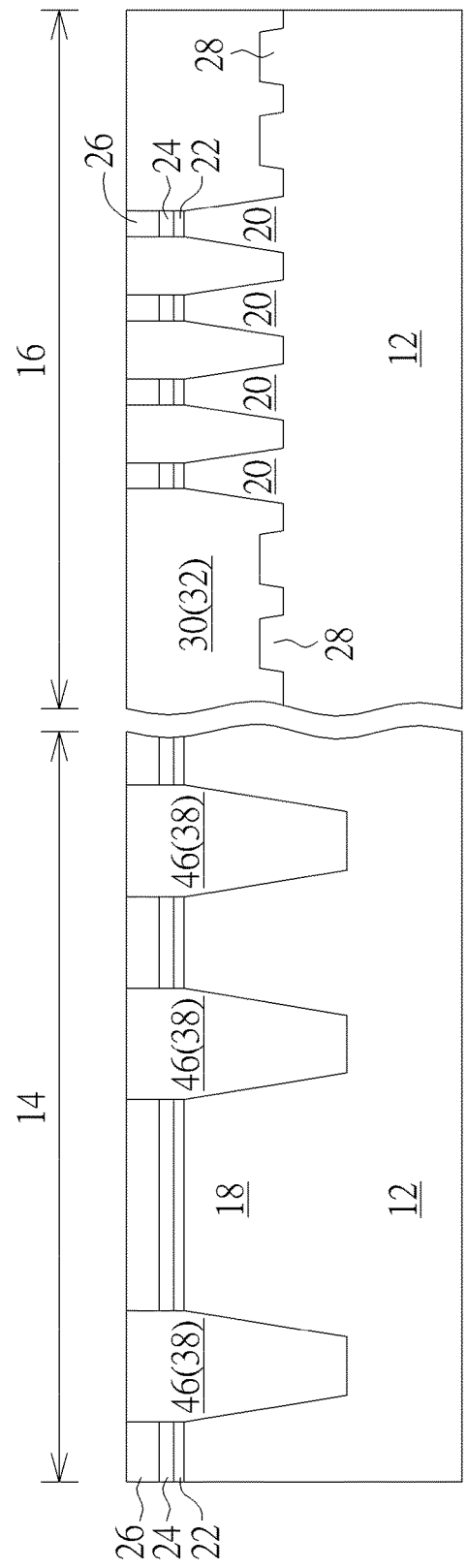

Next, as shown in FIG. 14, another planarizing process such as CMP process is conducted to remove part of the insulating layer 46 so that the top surface of the remaining insulating layer 46 even with the top surface of the STI 32 on the LV region 16 for forming a STI 38. Next, process conducted in FIGS. 6-10 could be carried out for fabricating transistors. For instance, it would be desirable to remove the hard mask 26 and the liners 22, 24 on the HV region 14 and LV region 16 and part of the STI 32 on the LV region 16, form a gate dielectric layer 52 made of silicon oxide on the base 18 on HV region 14 and the fin-shaped structures 20 on LV region 16, and then forming gate structures 40 or dummy gates on the base 18 and fin-shaped structures 20 respectively.

Overall, the present invention discloses a method for integrating HV device and LV device. According to the aforementioned embodiment as shown in FIGS. 1-6, it would be desirable to form a base and fin-shaped structures on the HV region and LV region respectively, form a STI 32 around the fin-shaped structures on the LV region, conduct a photo-etching process to remove part of the base for forming trenches, and then filling an insulating layer in the trenches for forming another STI 38. Alternatively, according to the embodiment shown in FIGS. 7-10, it would be desirable to form the STI 32 on the fin-shaped structures on LV region, perform a fin cut process through photo-etching process to remove part of the substrate, part of the fin-shaped structures, and part of the STI 32 on the HV region and LV region at the same time to form trenches, and then fill an insulating material in the trenches for forming another STI 38 on the HV region and the LV region simultaneously. By using this approach for fabricating HV device and LV device, the present invention is able to improve the issue of excessing loading when multiple planarizing process such as CMP processes were conducted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a high-voltage (HV) region and a low-voltage (LV) region;
   forming a base on the HV region and fin-shaped structures on the LV region;
   forming a first insulating around the fin-shaped structures; and
   removing the base, the first insulating layer, and part of the fin-shaped structures at the same time to form a first trench in the HV region and a second trench in the LV region.

2. The method of claim 1, further comprising:
   performing a first deposition process to form the first insulating layer;
   forming the first trench and the second trench after performing the first deposition process;
   performing a second deposition process to form a second insulating layer in the first trench and the second trench; and
   planarizing the second insulating layer to form a first shallow trench isolation (STI) on the HV region and a second STI on the LV region.

3. The method of claim 2, wherein the first deposition process and the second deposition process are different.

4. The method of claim 2, wherein the first deposition process comprises a flowable chemical vapor deposition (FCVD) process.

5. The method of claim 2, wherein the second deposition process comprises a sub-atmospheric chemical vapor deposition (SACVD) process.

6. The method of claim 2, wherein the first insulating layer and the second insulating layer comprise different materials.

7. The method of claim 2, wherein the first insulating layer comprises SiONH.

8. The method of claim 2, wherein the second insulating layer comprises $SiO_2$.

9. A semiconductor device, comprising:
   a substrate having a high-voltage (HV) region and a low-voltage (LV) region;
   a base on the HV region and fin-shaped structures on the LV region;
   a first shallow trench isolation (STI) around the fin-shaped structures; and
   a second STI around the first STI, wherein the first STI and the second STI directly contacting each other comprise different materials.

10. The semiconductor device of claim 9, wherein the first STI comprises SiONH.

11. The semiconductor device of claim 9, wherein the second STI comprises $SiO_2$.

12. The semiconductor device of claim 9, further comprising a third STI in the base.

13. The semiconductor device of claim 12, wherein the second STI and the third STI comprise same material.

14. A semiconductor device, comprising:
   a substrate having a high-voltage (HV) region and a low-voltage (LV) region;
   a base on the HV region and fin-shaped structures on the LV region;
   a first shallow trench isolation (STI) around the fin-shaped structures; and
   a second STI around the first STI, wherein the first STI and the second STI both on the LV region comprise different depths.

15. The semiconductor device of claim 14, wherein a depth of the second STI is greater than a depth of the first STI.

16. The semiconductor device of claim 14, wherein top surfaces of the first STI and the second STI are coplanar.

17. The semiconductor device of claim 14, further comprising a third STI in the base.

18. The semiconductor device of claim 17, wherein the second STI and the third STI comprise same depths.

19. The semiconductor device of claim 17, wherein top surfaces of the first STI and the third STI are coplanar.

20. The semiconductor device of claim 17, wherein the second STI and the third STI comprise different widths.

* * * * *